(12) United States Patent
Ku

(10) Patent No.: US 6,706,578 B2
(45) Date of Patent: Mar. 16, 2004

(54) FLOATING GATE FOR MEMORY AND MANUFACTURING METHOD THEREOF

(75) Inventor: Hsiu-Ling Ku, Hsinchu (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 10/227,954

(22) Filed: Aug. 26, 2002

(65) Prior Publication Data

US 2003/0146466 A1 Aug. 7, 2003

(30) Foreign Application Priority Data

Feb. 5, 2002 (TW) ...................................... 091101982 A

(51) Int. Cl.$^7$ .......................................... H01L 21/8238
(52) U.S. Cl. ....................... 438/201; 438/201; 438/211
(58) Field of Search ................................ 438/211, 256, 438/398, 255, 254, 296; 437/52; 257/410, 411

(56) References Cited

U.S. PATENT DOCUMENTS

| | | | | |
|---|---|---|---|---|
| 5,583,070 A | * | 12/1996 | Liao et al. | 438/398 |
| 6,218,260 B1 | * | 4/2001 | Lee et al. | 438/398 |
| 6,492,694 B2 | * | 12/2002 | Noble et al. | 257/410 |
| 6,500,709 B2 | * | 12/2002 | Parekh et al. | 438/255 |
| 2002/0009850 A1 | * | 1/2002 | Cheng | 438/256 |

* cited by examiner

Primary Examiner—David Nelms
Assistant Examiner—Thinh T Nguyen
(74) Attorney, Agent, or Firm—Ladas and Parry

(57) ABSTRACT

The present invention discloses a floating gate for memory of high gate coupling ratio and the method of manufacturing the same. It utilizes a continuously concave-convex surface formed on the floating gate, and by virtue of the increase of the surface area of which to increase the gate coupling ratio with a control gate and further to reduce the working voltages for programming and erasing.

5 Claims, 4 Drawing Sheets

FLOATING GATE FOR MEMORY AND MANUFACTURING METHOD THEREOF

BACKGROUND OF THE INVENTION (A) Field of the Invention

The present invention relates to a floating gate for memory and a manufacturing method thereof, and more specifically, to a floating gate for memory of a high gate coupling ratio and the manufacturing method.

(B) Description of Related Art

During the end of 1980s, a non-volatile erasable programmable read only memory (EPROM) has been developed, which had the advantages of low cost and high density. A flash memory, developed thereafter, follows the same method to proceed with the programming or erasing operations on an entire memory array at one time. The flash memory uses a positive potential on a gate to make the energetic electrons in a drain into the gate for programming. Moreover, the Fowler-Nordheim tunneling effect guides the electrons from the gate into a source for the erasing operation.

The conventional non-volatile flash memory uses a floating gate for conducting the memory programming or erasing, the manufacturing procedures are shown in FIG. 1(a) to FIG. 1(e). In FIG. 1(a), an isolated region on a silicon substrate 101 is defined by the shallow trench isolation (STI) technique, and an isolation oxide layer 102 is subsequently deposited for the isolation between each gates. The isolation oxide layer 102 is being polished until on a silicon nitride layer 103 on the active area by chemical mechanical polishing (CMP), a tunneling oxide layer 104 is interposed between the silicon substrate 101 and the silicon nitride layer 103. In FIG. 1(b), a groove is formed between adjacent isolation oxide layers 102 after removing the silicon nitride layer 103 for generating a floating gate afterward. In FIG. 1(c), a first polysilicon layer 105 is deposited on the isolation oxide layer 102 and the tunneling oxide layer 104 as a floating gate. In FIG. 1(d), planarization is performed by chemical mechanical polishing to polish the first polysilicon layer 105 until on the isolation oxide layer 102. In FIG. 1(e), it sequentially deposits a dielectric layer 106 and a second polysilicon layer 107 on the isolation oxide layer 102 and the first polysilicon layer 105. The dielectric layer 106 may be a composite layer of, for example, an oxide/nitride/oxide, namely the ONO structure, and the second polysilicon layer 107 is used as a control gate.

The memory cells in the flash memory require high voltages for programming. As the size of memory cells is shrinking, such high voltages usually cause some damages and further affects the reliability. The thickness of the tunneling oxide layer 104 is approximately 10 nm. Generally, it is very difficult to produce the tunneling oxide layer 104 with highly electron tunneling efficiency. Thus, increasing the gate coupling ratio (GCR) has become a solution for reducing the required voltage.

Normally, the effective capacitance of the gate ($C_{eff}$) is a combination of the capacitance of the tunneling oxide layer 104 ($C_{tox}$) and the capacitance of the dielectric layer, such as ONO, between the floating gate and the control gate ($C_{ONO}$), i.e. $C_{eff}^{-1} = C_{tox}^{-1} + C_{ONO}^{-1}$. Therefore, the coupling ratio of the gate is both proportional to the capacitance of the tunneling oxide layer 104 and to the capacitance of the dielectric layer 106.

The method for increasing the capacitance of the dielectric layer 106 comprises: (1) increasing the surface area of the capacitor, (2) reducing the thickness of the dielectric layer 106, and (3) using a material with high dielectric coefficient (high K), in which reducing the thickness of the dielectric layer 106 has a problem of electrons flowing from the floating gate to the control gate during working, and the use of high K material is still under development and has problems in maturity and process integration. Thus, the method of increasing the surface area of the capacitor is gradually becoming a trend of the gate coupling ratio increment.

SUMMARY OF THE INVENTION

The object of the present invention is to provide an inventive floating gate and a method of manufacturing the same so as to increase the gate coupling ratio and further reduce the required working voltage of the gate. The present invention uses a concave-convex rugged surface on the dielectric layer between the floating gate and the control gate to increase the surface area of the capacitors of the dielectric layer and the gate coupling ratio.

The concave-convex rugged surface can be formed by alternately depositing doped and undoped polysilicon layers in each of the grooves between isolation trenches until filling up the grooves, thus a longitudinally alternate doped and undoped composite polysilicon layer is formed, and then dry-etching of a fixed time to form the concave-convex rugged surface on the composite polysilicon layer. Due to the variation of etching rates for doped and undoped polysilicon, normally doped polysilicon has higher etching rate compared to the undoped polysilicon, the doped polysilicon layers will be formed as concave surfaces and the undoped polysilicon layers will be formed as convex surfaces.

The floating gate for memory of the preferred embodiment according to the present invention comprises a silicon substrate including at least two trenches, an isolation oxide layer covered on the trenches protruding from the silicon substrate, a tunneling oxide layer deposited on the silicon substrate between the trenches, a first polysilicon layer with a continuously concave-convex upper surface deposited on the tunneling oxide layer, a dielectric layer deposited on the first polysilicon layer and the isolation oxide layer, and a second polysilicon layer deposited on the dielectric layer, in which the isolation oxide layer is used to isolate each gates, the first polysilicon layer is used as a floating gate, and the second polysilicon layer is used as a control gate.

The method of manufacturing the floating gate for memory of the preferred embodiment according to the present invention includes the following steps of: providing a silicon substrate with at least two trenches; depositing an isolation oxide layer on the trenches until protruding from the surface of the silicon substrate: covering a tunneling oxide layer on the surface of the silicon substrate beside both sides of the isolation oxide layer; depositing a composite polysilicon layer on the surface of the isolation oxide layer and the tunneling oxide layer; polishing the composite polysilicon layer until exposing the isolation oxide layer; etching the composite polysilicon layer to form a continuously concave-convex rugged surface; annealing the composite polysilicon layer to be a first polysilicon layer; depositing a dielectric layer on the surface of the composite polysilicon layer and the isolation oxide layer; and depositing a second polysilicon layer on the surface of the dielectric layer.

The above-mentioned dielectric layer is composed of silicon oxide, silicon nitride and silicon oxide. The composite polysilicon layer is composed of 5 to 12 layers of the doped polysilicon and 5 to 12 layers of the undoped polysilicon, in which the thickness of the doped polysilicon layer or the undoped polysilicon layer is between 50 to 200 angstroms.

DETAILED DESCRIPTION OF THE INVENTION

Figure 1A:
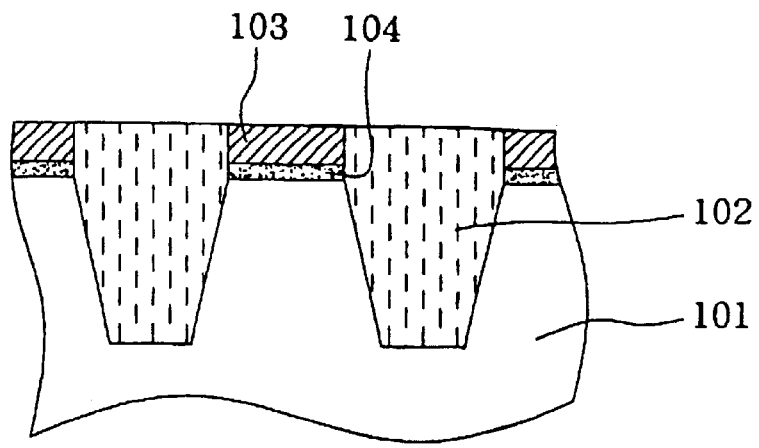
FIG. 1(a) to FIG. 1(e) illustrate a known process of manufacturing a floating gate for memory.
Figure 1B:
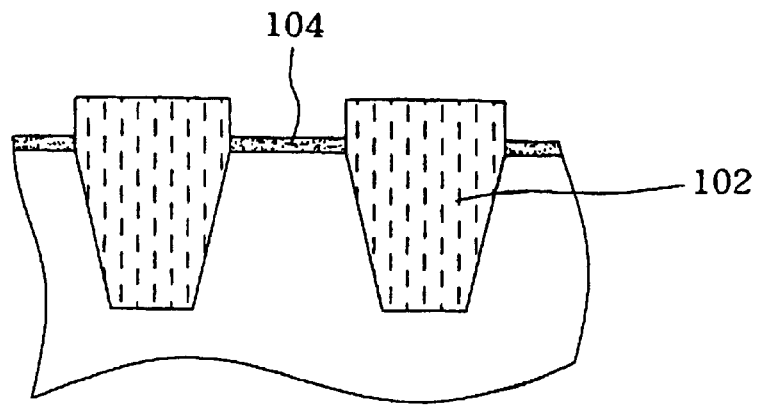
Figure 1C:
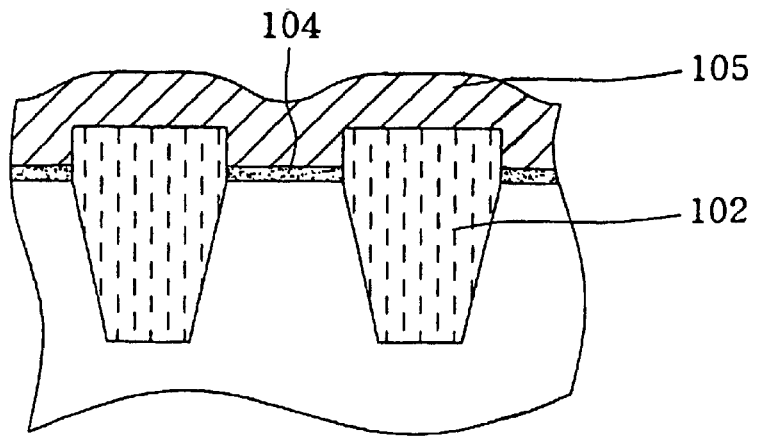
Figure 1D:
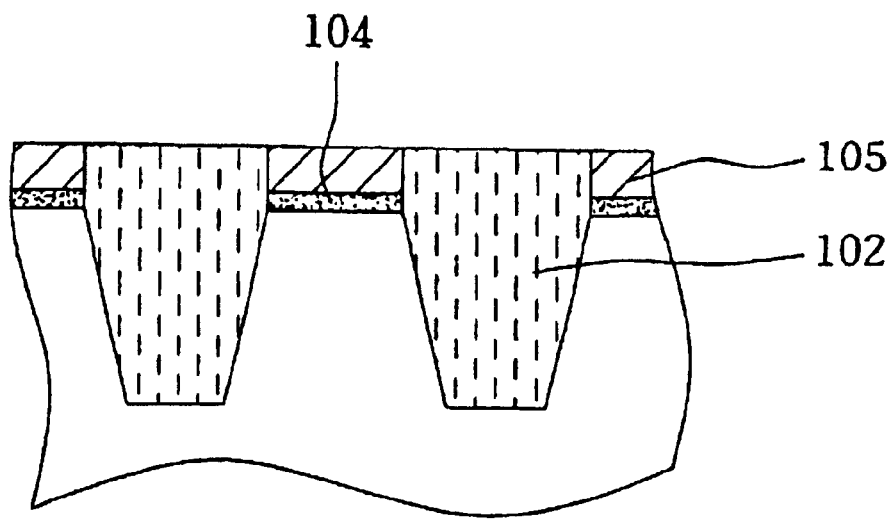
Figure 1E:
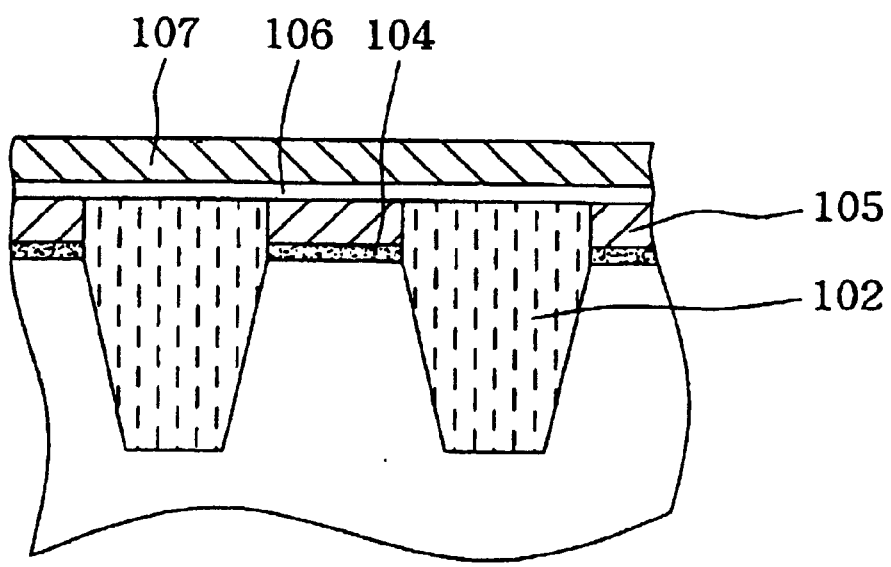
Figure 2A:
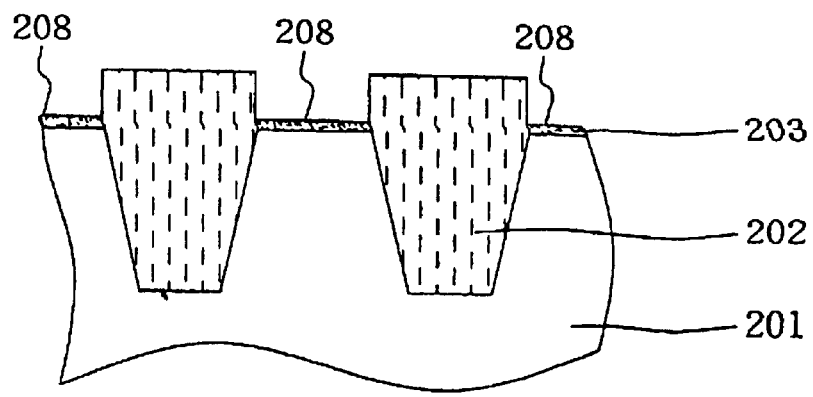
FIG. 2(a) to FIG. 2(f) illustrate a process of manufacturing a floating gate for memory in accordance with the present invention.
Figure 2B:
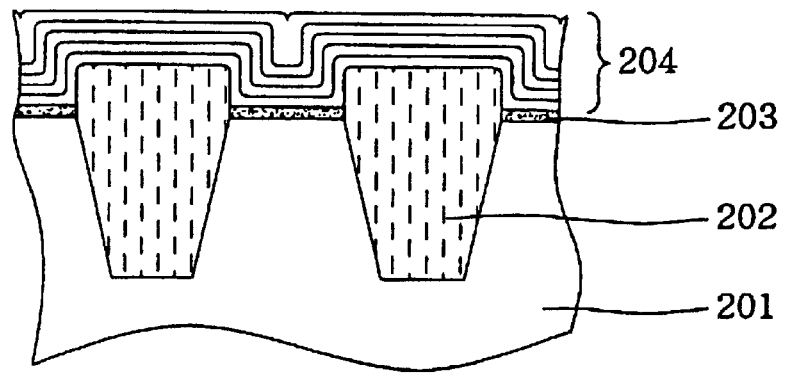
Figure 2C:
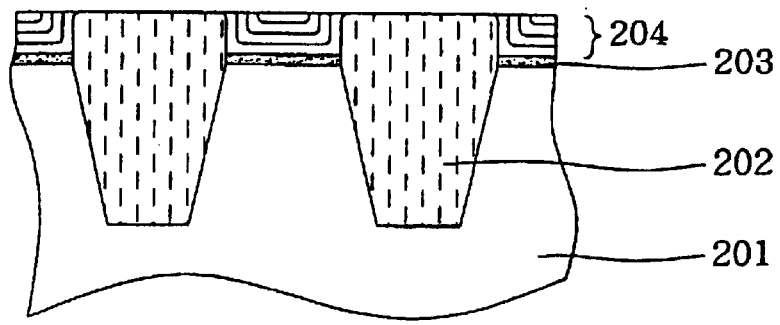
Figure 2D:
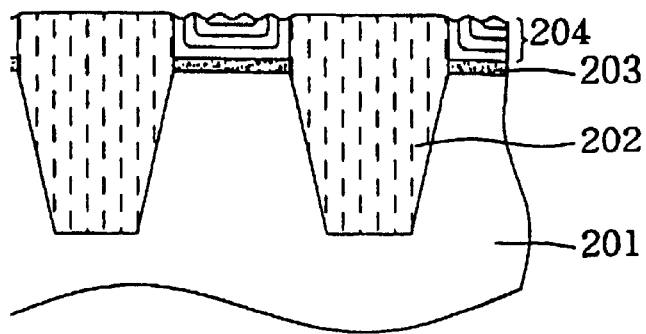
Figure 2E:
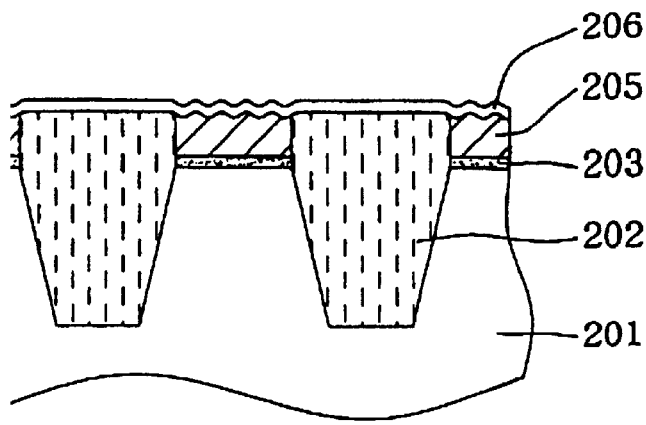
Figure 2F:
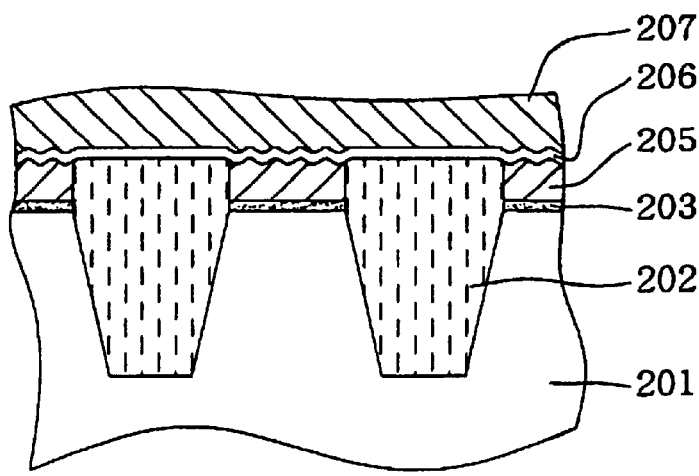

FIGS. 2(a) to 2(f) are the structures of each steps of the manufacturing process of a floating gate for memory according to the present invention. FIG. 2(a) shows the isolation structure between each gates, which includes a silicon substrate 201 with trenches in the isolation area formed by STI etching; an isolation oxide 202 covers the trenches and protrudes from the silicon substrate 201 to form a groove 208: and a tunneling oxide 203 deposited on the groove 208, the groove 208 is used as an area for forming floating gate. In FIG. 2(b), doped polysilicon layers and undoped polysilicon layers are alternately deposited until filling up the groove 208, wherein there is no restriction of firstly depositing the doped or the undoped polysilicon layer. The doped and the undoped polysilicon layers is formed alternately to generate a composite polysilicon layer 204 comprising 5 to 12 layers of the doped polysilicon and 5 to 12 layers of the undoped polysilicon. The thickness of the doped and the undoped polysilicon layers is between 50 and 200 angstroms. In FIG. 2(c), planarization is performed by CMP to polish the composite polysilicon layer 204 until on the isolation oxide 202. In FIG. 2(d), the upper surface of the composite polysilicon layer 204 constructed of alternating doped and undoped polysilicon layers is dry-etched into a concave-convex rugged surface, and the composite polysilicon layer 204 is annealed to uniform the doping concentration of the alternating doped and undoped polysilicon layers, and to form a first polysilicon layer 205 of final doping concentration between 1E14 to 1E22 per cubic centimeter. In FIG. 2(e), a dielectric layer 206, a composite layer composed of silicon oxide/silicon nitride/silicon oxide, namely ONO structure, is deposited. In FIG. 2(f), a second polysilicon layer 207 is deposited as a control gate. As a result, the floating gate for memory according to the present invention is formed.

Obviously, because the dielectric layer 206 in the present invention is provided with a concave-convex rugged surface, it can effectively increase the surface area of the capacitor of the dielectric layer 206 comparing with that of the prior art and further increase the gate coupling ratio to meet the requirement of low working voltages for the new generation memory.

The above-described embodiments of the present invention are intended to be illustrative only. Numerous alternative embodiments may be devised by those skilled in the art without departing from the scope of the following claims.

What is claimed is:

1. A method for manufacturing a floating gate of non-volatile memory, comprising the steps of:

providing a silicon substrate including at least two trenches;

forming an isolation oxide layer on said trenches and said isolation oxide layer protruding from said silicon substrate;

forming a tunneling oxide layer on said silicon substrate and beside both sides of said isolation oxide layer;

depositing a composite polysilicon layer on said tunneling oxide layer;

polishing said composite polysilicon layer until said isolation oxide layer is exposed;

etching said composite polysilicon layer so as to form a concave-convex rugged surface;

annealing said composite polysilicon layer so as to form a first polysilicon layer;

depositing a dielectric layer on said first polysilicon layer and said isolation oxide layer; and depositing a second polysilicon layer on said dielectric layer.

2. The method of claim 1, wherein said composite polysilicon layer includes five to twelve doped polysilicon layers and five to twelve undoped polysilicon layers.

3. The method of claim 2, wherein the thickness of said doped polysilicon layer is between 50 to 200 angstroms.

4. The method of claim 2, wherein the thickness of said undoped polysilicon layer is between 50 to 200 angstroms.

5. The method of claim 1, wherein said composite polysilicon layer is polished by chemical mechanical polishing.

* * * * *